United States Patent
Meyer (10) Patent No.: US 10,219,414 B2
(45) Date of Patent: *Feb. 26, 2019

(54) ENHANCING COOLING EFFICIENCY OF A COMPUTER ROOM AIR CONDITIONING UNIT

(71) Applicant: Raymond & Lae Engineering, Inc., Fort Collins, CO (US)

(72) Inventor: Gary Meyer, Berthoud, CO (US)

(73) Assignee: RAYMOND & LAE ENGINEERING, INC., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/849,141

(22) Filed: Dec. 20, 2017

(65) Prior Publication Data

US 2018/0116074 A1    Apr. 26, 2018

Related U.S. Application Data (63) Continuation of application No. 15/074,711, filed on Mar. 18, 2016, now Pat. No. 9,930,813.

(51) Int. Cl.
  *H05K 5/00*      (2006.01)
  *H05K 7/20*      (2006.01)
(52) U.S. Cl.
  CPC ..... *H05K 7/20745* (2013.01); *H05K 7/20009* (2013.01); *H05K 7/20836* (2013.01)
(58) Field of Classification Search
  CPC ........... H05K 7/20709; H05K 7/20718; H05K 7/20727; H05K 7/20745; F24F 7/10; F24F 13/0227; F24F 13/068

USPC ....... 454/184, 185, 246, 289, 264–268, 347, 454/358; 361/694; 49/92.1; 52/302.1, 52/473

See application file for complete search history.

(56) References Cited

U.S. PATENT DOCUMENTS

| | | |
|---|---|---|
| 4,860,163 A | 8/1989 | Sarath |
| 6,896,612 B1 | 5/2005 | Novotny |
| 7,031,154 B2 | 4/2006 | Bash |
| 7,823,340 B2 | 11/2010 | DeJonge |
| 8,640,479 B2 | 2/2014 | Bettella |
| 9,930,813 B2 * | 3/2018 | Meyer ................ H05K 7/20745 |

* cited by examiner

*Primary Examiner* — Vivek Shirsat
(74) *Attorney, Agent, or Firm* — William W. Cochran; Cochran Freund & Young, LLC (57) ABSTRACT

A method for enhancing the cooling efficiency of a computer room air conditioning unit, in a data center, is provided. Raised floor panels are carried on a pedestal support system. The floor panels divide a data center, into upper and lower plenums. A cold aisle is includes air-grate floor panels. The computer room air conditioning unit is operated to condition a heated hot aisle return air flow. A server rack has a front, a back, and side rack support frame members. The support members define an interior server compartment. At least one damper door frame has a top, a bottom and side members. The door frame members define at least one open air flow panel portion. A series of horizontal damper blade members are pivotally mounted in the open panel portion. The damper blade members are pivoted to direct a stream of the conditioned air flow over heat generating components contained in the interior server compartment in order to elevate the temperature of the heated return airflow at the air conditioning unit.

8 Claims, 7 Drawing Sheets

ENHANCING COOLING EFFICIENCY OF A COMPUTER ROOM AIR CONDITIONING UNIT

CROSS-REFERENCE TO RELATED APPLICATION

This application is a continuation of U.S. Non-Provisional patent application Ser. No. 15/074,711 entitled "Method for Enhancing Cooling Efficiency of a Computer Room Air Conditioning Unit" by Gary Meyer, filed Mar. 18, 2016, the entire contents of which are specifically incorporated herein by reference for all that it discloses and teaches.

BACKGROUND OF THE INVENTION

1. Field of the Invention.

The present invention relates to data center cooling efficiency. In particular, it relates to a method for enhancing the cooling efficiency of computer room air conditioning units.

2. Description of the Related Art.

Raised floors are used in data centers to create a space between a sub-floor of the building and the normal working environment of the computer room. The space between the sub-floor and the raised floor panels creates an under-floor cool-air circulating plenum for thermal management of the data processing servers installed in banks of rack systems on top of the raised floor. The floor panels, themselves, are either solid or perforated. Of the perforated panels, manufacturers have made new design changes in an effort to increase the available open area of the panels, in order to increase the air flow of cooling air throughout the room. These efforts have led to the production and use of air-grate raised floor panels.

Air-grate panels use an open frame design so that cooling air, originating in the under floor, or lower, plenum flows upwardly through the openings in the air-grate frame and into the computer room in order to aid in cooling the server racks installed on top of the raised floor. The air-grate panels may also include perforated top plates, connected to the air-grate structural frame members, in order to provide a variety of different working surfaces having a desired aesthetic appearance, or with the perforations, or openings, in the plate configured so as to comply with certain federal and state regulations, as they relate to occupational safety and/or persons with disabilities, or to increase air flow and cooling efficiency.

Overall, the cooling components, of a computer room, are charged with creating, and moving air on the data center floor. From there, the room itself must maintain separate climates in relation to the cool air, which is required by the servers, and the hot air which they exhaust. Without separate boundaries, the air paths mix, resulting in both economic and ecological consequences. Air-grate panels are thus key cooling components in the overall design and construction of computer rooms. With a raised floor, the use of air-grate panels is a way to separate the computer room into a "lower-plenum/upper-plenum" air handling boundary configuration where the cooling air "originates" in the lower plenum, flows upwardly through the openings in the air-grate panels, and is made available to flow through the server doors, for cooling the server racks, installed on the raised floor, in the upper plenum of the computer room. In operation, the data processors heat the air, in the upper plenum, as it flows through the server, where it is returned to the computer room air conditioning units ("CRAC") for cooling, and recycling the conditioned air back into the lower, or under-floor, plenum.

A further refinement, in the use of air-grate floor panels, came in the early 2000s, when scientists advanced the concept of "hot aisle/cold aisle", as an additional means for attempting to achieve air separation within the server room. This design uses a system which includes three basic components to achieve hot aisle/cold aisle separation. Those components involve the use of air conditioners, fans and perforated raised floor panels in combination to act synergistically in the construction of a cooling infrastructure, as a means to separate and contain the inlet cold air and the exhaust hot air. With this approach, the racks are supported on a raised floor and are connected into a series of rows. The fronts of the racks face each other and become the cold aisles, as a result of the inherent front-to-back heat dissipation of most IT equipment. The CRAC's are positioned around the perimeter of the room, or at the end of hot-aisles, so that they push cold air under the raised floor and through the cold aisle. The perforated raised floor panels are placed only in the cold aisles which concentrates cool air to the front of racks in order to get sufficient air flow into the server intake. In this manner, all of the servers should be mounted so that their server door air intake is facing the front of the rack, and their exhaust door is facing the rear. As the air moves through the servers, it is heated and eventually dissipated into the hot aisle. The exhaust air is then routed back to the air handlers.

This design, which aligns data center racks into alternating rows, endures in critical facilities throughout the world, and is widely regarded as the first major step in improving airflow management. In use, part of this air flow, or stream, enters the racks and then the equipment, and part of the air flow bypasses the equipment and returns to the air handling units. The air that enters the server doors is heated, and then exhausted through the back of the servers where it is recycled as return air into the air handling units. Typically, some intermixing of the hot and cold air paths is experienced due to improper sealing in the rack, or recirculation above and around the sides of the rack rows.

Other conditions occur which interfere with optimum cooling efficiency in the "hot aisle/cold aisle" constructions, as well. For example, "bypass air" is an interfering condition observed when conditioned air that does not reach computer equipment escapes through cable cut-outs, holes under racks, or misplaced perforated tiles or holes in the computer room perimeter walls. Bypass air limits the precise delivery of cold air at the server door intake. "Hot air recirculation" is also an interfering condition found under conditions where waste heat enters the cold aisle. In order to combat this condition, operators ensure that the cooling infrastructure must throw colder air at the equipment to offset mixing. Another such condition is hot air contamination which prohibits the air handlers from receiving the warmest possible exhaust air, rendering their operation less efficient. Finally, hot spots may persist as a result of any, or all, of the above conditions.

Concomitant with the ever increasing advancements in the volume and speed within which data is processed; data center operators are observing a rise in the energy of the thermal dissipation for the data processor equipment installed in upper plenum of the center. Indeed, the thermal dissipation energy, resulting with the use of such technologies, is now exceeding the operational design limitations, for even the most popular designs of air-grate floor panels in use today, in even those computer rooms which employ the lower-plenum/upper-plenum and hot aisle/cold aisle air separation boundary layer technologies. These uses generate enormous heat loads, on the system, for dissipation, within the same volumetric area, which significantly increases the concentration of heat applied to the internal data processing conductors in the server. For example, it is not uncommon to now experience server racks pushing 7 kw per rack, with operational expectations within the industry of scaling upwards to a 12-30 kw use. Thus, certain manufacturers of air-grate floor panels are experimenting with designs which further increase the available open area of the openings in the air-grate or perforations in the panel top plate. In addition, operators are also working on ways to lower the temperature set-point of the entire data center in order to enhance cooling of those computer servers which are positioned in the upper reaches of the server racks, in the upper plenum. However, the first design solution includes inherent structural load and safety limitations, and the second operational solution significantly drives up the cost in providing electrical utilities to the center.

Another structural solution is directed toward an effort in continuing to redesign the air flow characteristics of the air-grate panels themselves, with an appreciation in both the air flow separation dynamics, when passing through the flat bottom of the slotted air-grate, and also as to air flow passing through the air-grate when installed on a pedestal support system. One such design is illustrated in U.S. Pat. Ser. No. D567,398, to Meyer. There, it is ordinarily observed that air scoops are projecting downwardly as part of the superstructure of the air-grate frame. It is readily apparent that the scoop design would act to capture air, as it flows in a generally horizontal direction through the lower plenum of a raised floor. A fluid dynamic, inherent in such design, would result in an increase in the velocity of the air flowing from the lower plenum, as it curves upwardly when passing the scoop, and into the upper plenum, of a computer room, through slotted perforations in the air-grate floor panel plate. This increase in velocity would seem to enhance cooling and further promote the creation of air separation barriers within the computer room.

As mentioned above, the concept of "hot aisle/cold aisle" uses improvements in the design and location of air conditioners, fans, and the raised floors as the cooling infrastructure and focuses on separation of the inlet cold air and the exhaust hot air through the system. However the construction and configuration of the server doors themselves is also a significant parameter in the overall design of the system which has yet to be fully realized. Early versions of server enclosures, often with "smoked" or glass front doors became obsolete with the adoption of "hot aisle/cold aisle" technologies. As a result, the use of perforated doors became necessary for the "hot aisle/cold aisle" approach to work. For this reason, perforated doors remain the standard in the industry for most off-the-shelf server enclosures. Indeed, there exists some debate relating to the total percentage of surface area in the server doors which is required to achieve optimal cooling. For example, certain manufactures have now have established designs which include a percentage of perforation in the range of 65% to over 80% of the total surface area of the door.

While the foregoing methods and materials are useful in providing thermal separation in data centers adopting the hot aisle/cold aisle strategies in the scheme of construction, there still exists a need to provide improvements in the cooling efficiency of the CRAC units. The present invention satisfies these needs.

BRIEF SUMMARY OF THE INVENTION

It is therefore an object of the present invention to provide a method for improving the cooling efficiency of a computer room air conditioning unit in a data center.

It is yet another object of the present invention to provide improvements in the structural design of the data center to improve the cooling efficiency of the computer room air conditioning units in a cold aisle/hot aisle containment system.

To overcome the problems of the prior art, and in accordance with the purpose of the present invention, as embodied and broadly described herein, briefly, a method for raising the cooling efficiency of a computer room air conditioning unit, in a data center, is provided. Raised floor panels are carried on a pedestal support system. The floor panels divide a data center, into an upper and a lower plenum. A cold aisle is provided where at least one row of the floor panels includes air-grate floor panels. The computer room air conditioning unit is operated to condition a heated return air flow from said upper plenum and deliver a conditioned air flow into the lower plenum. A server rack has a front, a back, and side rack support frame members. The support members define an interior server compartment being ventilated, but not sealed, with respect to the conditioned air flow. At least one damper door frame has a top, a bottom and side members. The door frame members define at least one open panel portion established there between. A series of horizontal damper blade members are pivotally mounted in the open panel portion. The damper blade members are pivoted to adjust a stream of the conditioned air flow over a heat generating component contained in the interior server compartment in order to maximize the temperature of the heated return airflow at the air conditioning unit.

Additional advantages of the present invention will be set forth in part in the description that follows and in part will be obvious from that description or can be learned from practice of the invention. The advantages of the invention can be realized and obtained by the invention particularly pointed out in the appended claims.

BRIEF DESCRIPTION OF THE SEVERAL VIEWS OF THE DRAWINGS

The accompanying drawings, which are incorporated in and which constitute a part of the specification, illustrate at least one embodiment of the invention and, together with the description, explain the principles of the invention.

DETAILED DESCRIPTION OF THE DRAWINGS

Unless specifically defined otherwise, all scientific and technical terms, used herein, have the same ordinary meaning as would be commonly understood by one of ordinary skill in the art to which this invention belongs. In practice, the present invention improves CRAC cooling efficiency by generally ensuring that the cold air stays at the server intake, while the computer room air conditioners, or air handlers, receive the warmer exhaust air, improving their efficiency. Moreover, the invention enhances the "capture of exhaust air" via in-row air conditioners which condition it and return it to the upper plenum through the cold aisle. Air conditioning efficiency is thereby improved as neither the hot exhaust air nor cold inlet air has far to travel. The term "lower plenum" means that portion of the computer room below the air-grate floor panels when installed on a pedestal support system. The term "upper plenum" means that portion of the computer room above the air-grate floor panels, including the data processing server equipment and in-row air conditioners, or air handling units. Thus, the term "computer room" means the overall air handling environment including the upper and lower plenums from the subfloor to ceiling. Finally, "CRAC units" means those computer room air conditioning units typically located at the perimeter of the data center floor surrounding the (server) racks, or in-rows, to circulate air in the data center space to create a cooling loop.

Although any methods and materials similar or equivalent to those described herein, can be used in the practice or testing of the present invention, the preferred methods and materials are now described. Reference will now be made in detail, to the presently preferred embodiments of the invention, including the examples of which are illustrated in the accompanying drawings. In the drawings, like numerals will be used in order to represent like features of the present invention.

The present invention provides a cold aisle/hot aisle containment system for improving the CRAC units cooling efficiency in a data center. As shown in the drawing figures and in conjunction with the presently preferred embodiment of the present invention, an air-grate floor panel is one of the components of the system. The air-grate includes a perforated floor panel top plate 13, having upper 16 and lower 14 surfaces. In the drawing figures, the air-grate of the present invention is only illustrated in the presently preferred embodiment which includes the perforated top plate 13, with slots, for the purpose of illustrating the best mode of the presently preferred embodiment, and not by way of limitation.

Figures 1, 3:
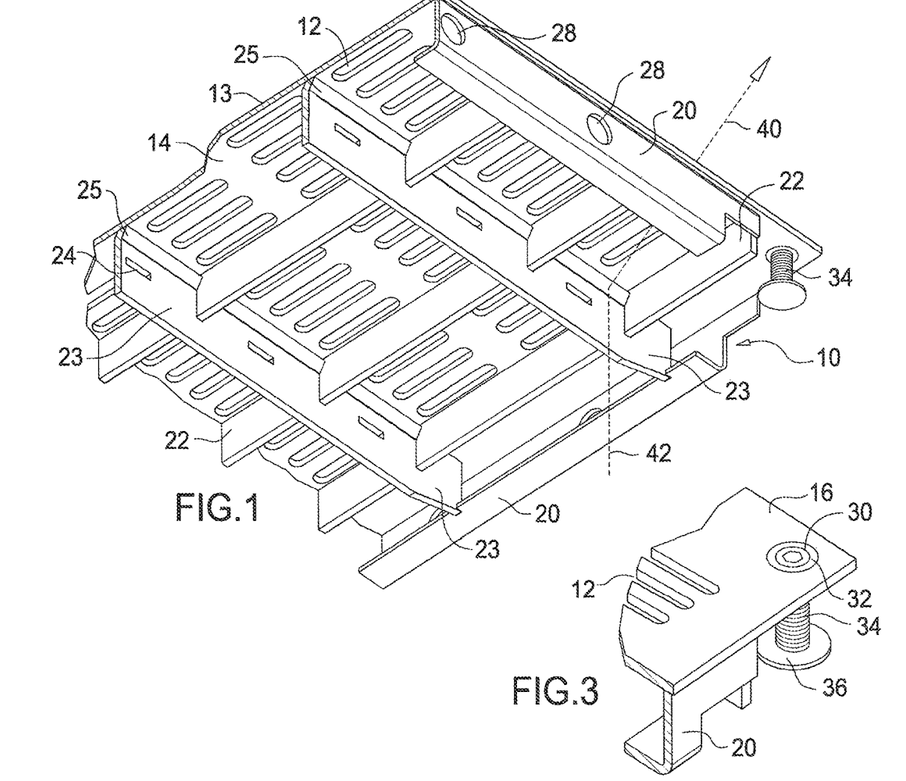
FIG. 1 is an isometric view of the directional flow air-grate for use as a component in the method of the present invention the top plate, as the working surface, together with air flow vanes and leveling screws, threaded into each of the corners of the top plate, for horizontal alignment of the air-grate with the raised floor.
FIG. 3 is an enlarged isometric view of a corner portion of the air-grate showing the panel leveler assembly.
Figure 2:
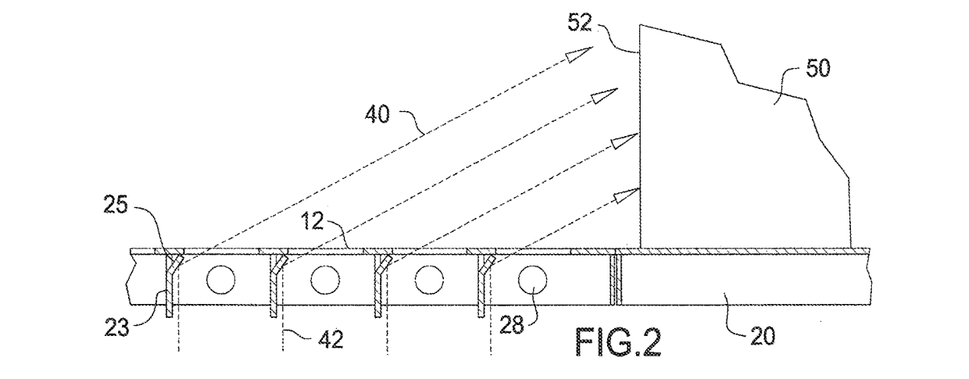
FIG. 2 is sectional side view showing the air foil vanes as they direct a flow of cooling air, on an inclined plane, toward the damper blade members of the damper door installed to cover the cold air intake openings of the computer rack.

Thus, overall the air-grate 10 is a load bearing box-frame. The box-frame includes a four vertical girders 20 connected in a ninety-degree alignment, to one another, so that four corners of the frame are capable of supporting the air-grate 10 as an air handling separation barrier on a raised floor pedestal support system. A series of vertical reinforcing rib members 22 are connected to the frame in a longitudinal spaced relationship. As shown in FIG. 1-3, at least two vertical airfoil vane members, may but need not, include an upper inclined surface 25 and a lower vertical planar surface 23. In an alternative embodiment, illustrated in FIG. 8, the vertical airfoil vane members 83 are configured to include a lower inclined surface and may, but need not, be aligned so that the vane members 83 form an outwardly tapering concentric box shape which allows for the cooling air to be dispersed in all four directions. With this embodiment, the air-grate floor panel is easily installed without regard to the alignment of the airfoil van members in relation to the server rack doors.

Referring back to FIGS. 1-3, the surfaces 23, 25 are desirably formed from a blank steel stock with a bend along the longitudinal axis of the stock which demarcates the vertical 23 and inclined 25 surfaces. The demarcation results in a curvature which gives the vane its shape as an airfoil. The airfoil has all of the physical and air flow dynamic attributes of a wing, or fin, when subjected to a passing current of air. The airfoil vanes are connected to the girders 20, in the frame 10, in an alignment which is crosswise to the reinforcing beam members 22. This alignment results in a series of generally square or rectangular voids within the framework, which serves as the openings for ducting the lower plenum airflow past the airfoil surfaces 23 and 25. The openings are sufficient is size, and are shaped so that the upper inclined planar 25 surface, or the airfoil, is capable of directing cooling air 42, originating in the lower plenum and traveling in a generally horizontal direction, through the openings and then upwardly, on an inclined plane, so that the cooling air flow 40 is directed to impact the cold air intake surface 52, of a data server rack 50, to be cooled.

By including the top plate 13, the directional flow air-grate 10 is also useful in combination with, or retrofit to, any raised access floor pedestal support system which is well known in the art. The air-grate 10 and top plate 13 are preferably fabricated of steel which is cut, welded, drilled, die-cast, and/or pressed in to subassemblies, or completed panels, in the shop for final finishing, such as powder coating, warehousing, order, and rapid shipment. The top plate 13 includes a plurality of openings which may be circular, but are desirably slotted with a long axis extending in the direction which impacts the frontal plane of the server racks to be cooled, and perpendicular in alignment to the long axis of the airfoil vanes. As shown in the drawing figures, the floor panel plate 13 is supported on the air-grate 10 frame 20, and is connected to the lower surface 14, of the top plate 13. The four corners, defined by girders 20, act to support the plate 13 on the pedestal head 66 members, of the raised floor support system.

The air-grate 10 includes at least two vertical airfoil vane members which have vertical 23 and inclined 25 surfaces connected to the support frame 20. The airfoils are arranged in a horizontally spaced relationship to one another, and in a crosswise spaced relationship to the reinforcing beams 22. With this configuration, the openings operate in a like manner as would an air flow duct in creating a void for directing the cooling air 42 upwardly through the slots 12 in the floor panel plate 13. The inclined planar surfaces 25 are positioned adjacent to the lower surface 14 of the floor panel 10 so that the surfaces 25 direct cooling air 42 from the lower plenum, of the raised floor, through the long axis of the slots 12, on an inclined plane which impacts the cold air intake surfaces 52 of a data server racks 50, to be cooled.

Figure 8:
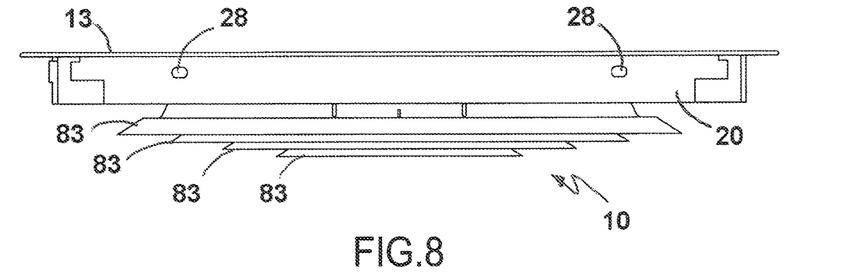
FIG. 8 is a side view, showing one embodiment of the air grate floor panel component of the method, where the air-grate support frame includes the air flow vanes in an embodiment where the vanes have an angularly flange shaped portion and are aligned in a concentric and outwardly tapering configuration.
Figure 9:
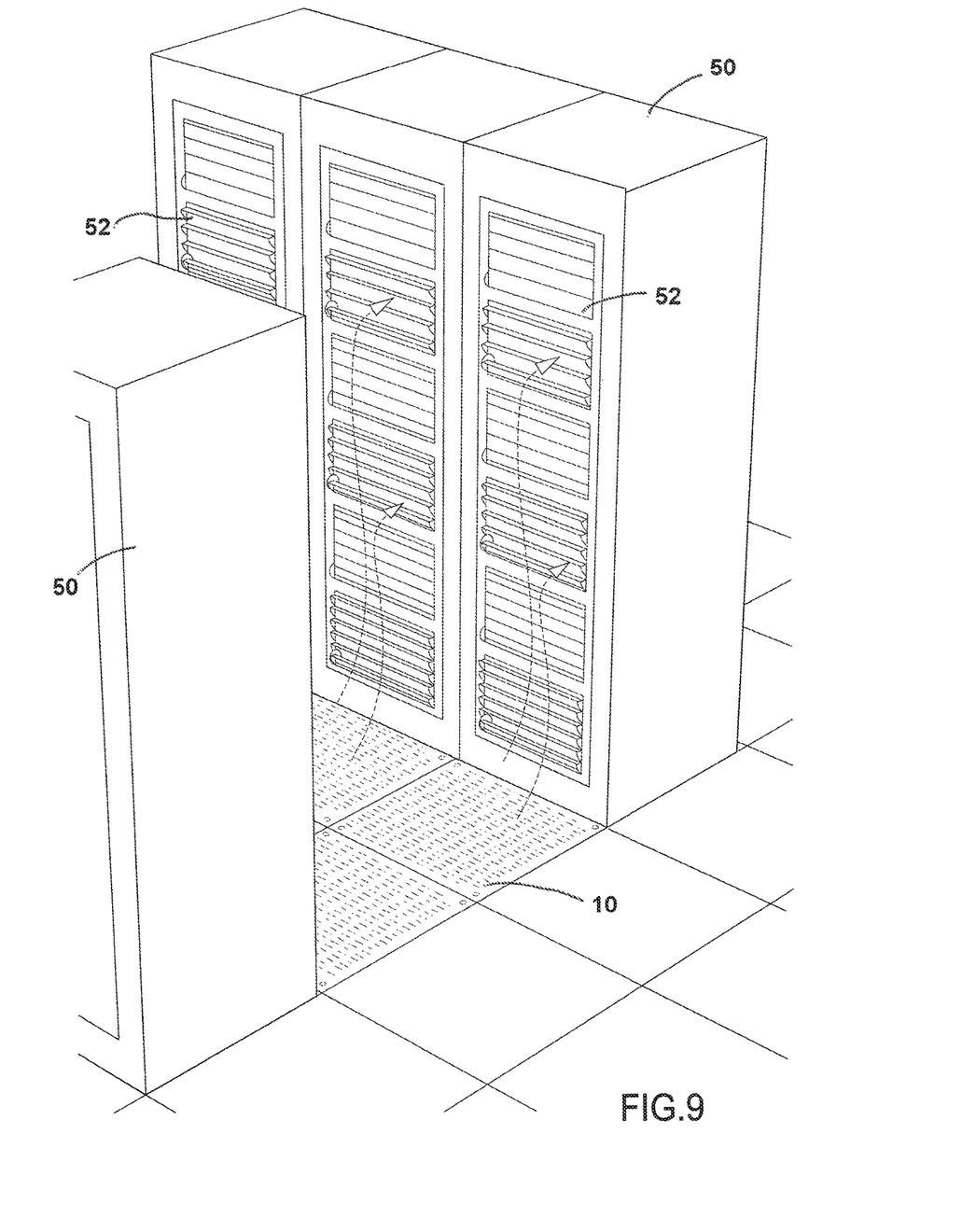
FIG. 9 is a perspective view showing the air-grate floor panels installed as two rows capable of defining a cold aisle between the banks of server racks which are positioned on each side of the cold aisle with damper doors facing the cold aisle so that cold air is directed into the air intake portion of the server racks.

The vane members include an upper edge and a lower edge. The upper and lower edges define a chord length. In the presently preferred embodiment, the inclined surface 25 extends downwardly from the upper edge to a predetermined point, along the airfoil, which is less than the chord length. However, as specifically contemplated herein, the inclined surface extends upwardly from the lower edge of the vane members, as shown in FIG. 8. For example, but without limitation, the inclined surface 25 extends downwardly to a distance which is between one-half to one-third of the chord length. The longitudinal axis of the airfoil vane is desirably aligned, for connections within the support frame, perpendicular to the long axis of the slots 12. This configuration greatly enhances the rate and direction of the airflow 40 at an incline to the frontal intake 52 of the server racks 50. As one may readily appreciate, by horizontally rotating the floor panel 10, in either a ninety or one-hundred-eighty-degree direction, on the pedestal support stringers 70, one can easily cause the air flow 40 to be re-directed in a desired direction for optimum cooling efficiency. Again, this feature is also useful in retrofit applications, or when replacing floor panels from one room to another.

It is even more desirably to cut or drill a series of longitudinally spaced clear holes, or slots 24, along the long axis of the airfoil vertical vane surface 23 in order to enhance an even distribution the cooling air flow 42 throughout the cold aisle 56. It is even more desirable to include a series of longitudinal spaced clear holes 28, in the girders 20 so that the cooling air 42 circulates freely between the air-grates 10, when they are installed in a row, or multiples of adjacent rows. In this manner, the clear holes 28 operate in reducing short cycle of the air-grate 10 within the operable design of the cold aisle 56.

One problem, which routinely exists when looking for suitable air-grate panels for use as replacement panels to an original equipment manufacture floor system, is that the floor panels must be of an exacting vertical thickness dimension to that the working surfaces fit in a horizontal planar alignment with the other elements of a raised floor. This problem often requires one to seek out a manufacture of individual panels, on a per-piece custom order basis, with the exacting dimensions. Obviously, this approach delays installation time and drives up the costs often associated with an entire shut-down of the entire computer room. However, the directional air-grate 10 component of the method, in accordance with the present invention, is easily adapted for use with a wide variety of original equipment under-floor supporting structures. With that purpose in mind, the air-grate floor panel plate 13 includes a clear hole 30, positioned adjacent to each corner of the floor panel plate 13, for access to a the panel leveler 34 from the upper surface 16, of the panel plate 13. The leveler 34 includes components which preferably, but need not, include an internally threaded collar 32, which is vertically connected, preferably by welding, to the underside 14 of the floor panel plate 13 in axial alignment with the clear holes 30. The panel leveler 34 operates as a set screw, having an upper tool receiving end, and a lower foot end 36. The foot end 36 is used to bias against the pedestal head 66. By turning the set screw 34, from the tool receiving end 30, the installer easily positions the upper surface 16, of the plate 13, to a predetermined level in relation to a pedestal support head 66 so that the floor panel plate 13, is perfectly aligned with the horizontal plane previously established by the raised floor. This feature, when used in combination with the air-grate 10 and plate 13, is particularly useful in eliminating trip hazards without the need to remove the panels and to make adjustments to the pedestal supports, themselves.

Figure 4:
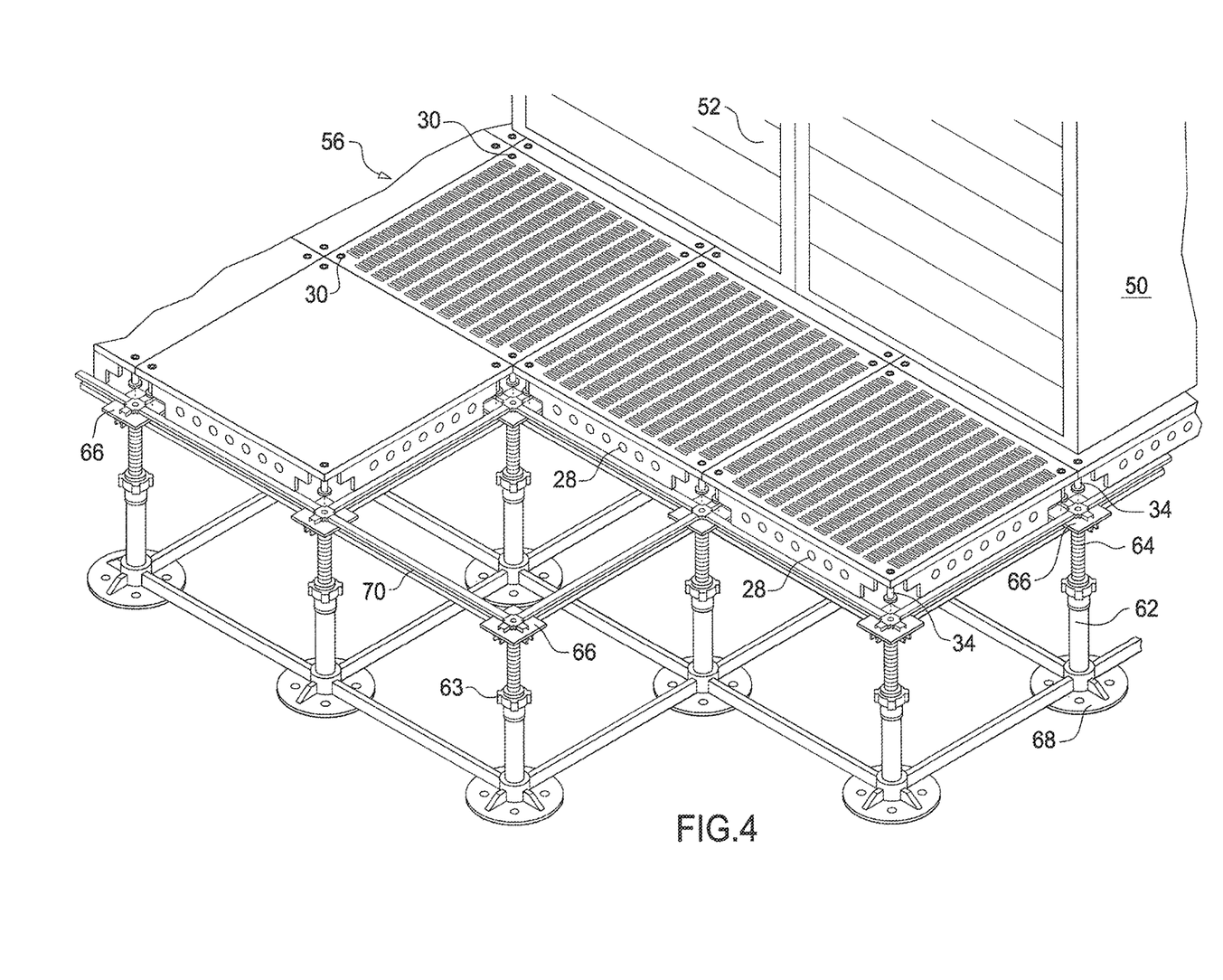
FIG. 4 is an isometric view of the air-grates, as a component in the system, aligned in a row which is adapted to form the cold aisle.
Figure 5:
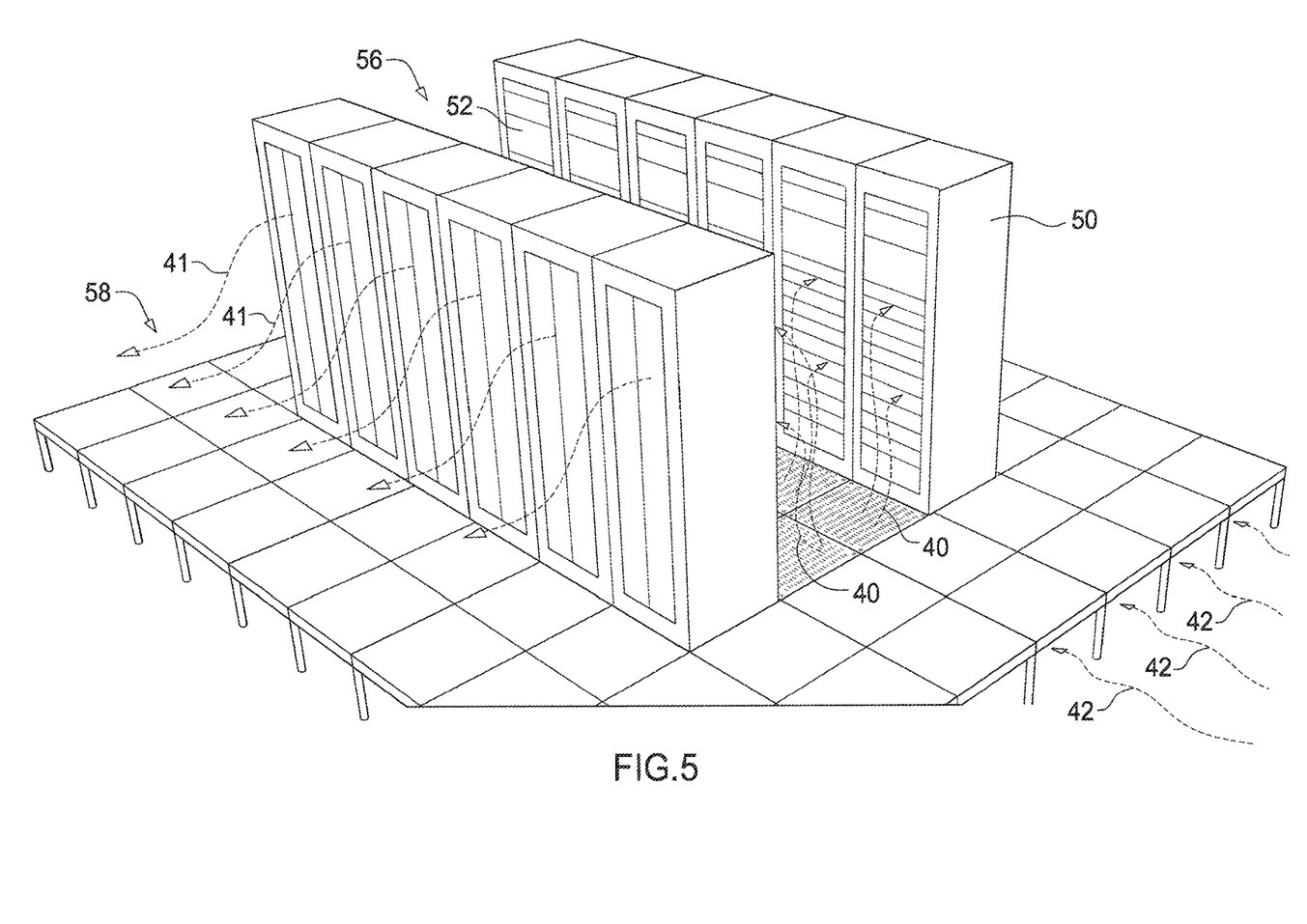
FIG. 5 is an isometric view of the method, in accordance with the present invention, which illustrates the desired air flow separation barriers achieved in use with the air-grate panels and server doors.
Figure 6:
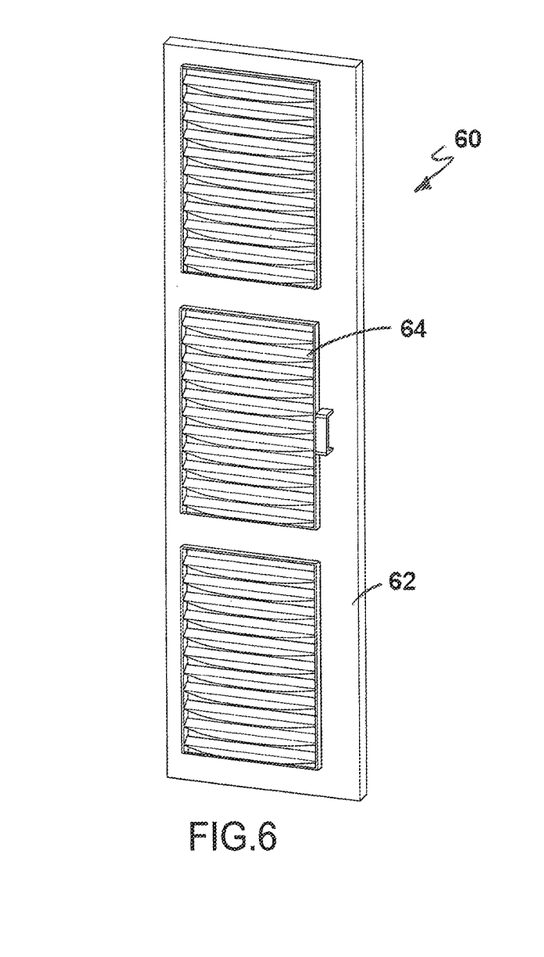
FIG. 6 is a front view of the server damper door, as yet another component of the method, for use in covering the front air intake of the computer server so that the damper blades direct a flow of cooling air from the cold aisle into the server rack.

Turning now to FIGS. 3 and 4, in use, the directional air flow air-grate 10 is a key component part in the overall design on the method by directing cooling air 40 at an incline to the frontal intake surface 52 of a data server racks 50. This method is suitable for use on any a pedestal support system which is well known in the art. Such systems typically include a plurality of vertically extending adjustable pedestal support members. The pedestal support members each having an upper externally threaded rod 64, connected to a pedestal support head 66, and a lower internally threaded tube 62, connected to a pedestal support base 68. Once adjusted to the desired vertical height, the threaded tube 62 and rod 64 are fixed in their relative positions with a lock nut 63. The pedestal support bases 68 are connected to the subfloor of a raised floor data center building construction. The pedestal supports are each connected in a square, or rectangular, matrix orientation with a plurality of horizontal stringers 70. The matrix is configured in a predetermined dimension which is consistent with the dimension of the air-grates 10, to be installed on pedestal support heads 66. In this manner, it may, but need not, be constructed to accommodate floor panels 10 having a rectangular dimension (not shown), as opposed to square, a determination which may be dictated by the amount of required space between server racks, according to any particular application of use, or by state or federal regulation.

The air-grates 10 are mounted in a course, or row, on the pedestal heads 66 and stringers 70 so that a cold aisle 56 is formed in front of a row of data processing server racks 50. As above, the directional air flow air-grates 10 desirably have a perforated top plate 13 which includes the clear slots 12. The air-grate frame 20, is connected to the lower surface 14 of the top plate 13, has the four girders 20 which are the main support for the plate 13. The girders 20 preferably have a lower flange for additional structural strength, and to facilitate alignment and support of the girders 20 in the stringers 70. The vertical airfoil vane members are connected to the support frame. As above, the airfoil vane members include the upper inclined planar surface 25, extending along a longitudinal axis of the vane, which acts to direct a pressurized cooling air from the lower, or under floor, plenum, of the raised floor, through the slots 12, in plate 13, on a plane which is inclined to the cold air intake plane of a data server rack 50, to be cooled.

It is inherent in the construction of a raised floor that in includes a lower air plenum which advantageously creates a void between the subfloor, of a raised floor data center, and the lower surface of the air-grate 10 for separation of the air delivery and handling in the room. The CRAC units are used to remove and return heated air 41, separated in the upper plenum, cool that air, and pressurize the lower plenum with a predetermined volume of the cooling air 42. The inclined surface 25 of the airfoil then acts to direct the pressurized cooling air 42, in the lower plenum, through the openings in the air-grate, or slots 12 in the panel plate 13, when used, on an inclined plane toward the cold air intake surface 52 of a data server rack 50, to be cooled. It is preferred that the airfoils are connected so that their longitudinal axis is in perpendicular alignment to the long axis of the slots 12, that the support frame further include a series of vertical reinforcing beams 22 extending in parallel alignment to the long axis, that the air foil vane vertical surfaces 23 have a series of longitudinally spaced clear holes, or slots 24, and that the plate 13 include the panel leveler 34 components.

By way of example, and not by limitation, heated return air (27° C.) 41, is generated during the operation of the data server racks 50 when it is exhausted through the server racks 50 and into the hot aisles 58 area behind the server racks. The heated air 41, or return air, flows into the CRAC units which are located in the computer room on top of the raised floor. In this example, the return air 41 is conditioned to 18° C., by the CRAC units, and is ducted downwardly into the lower, or under-floor, plenum where it acts to pressurize the lower plenum, causing a positive pressure differential, in relation to the upper plenum portion of the computer room, above the raised floor. This pressure differential causes the conditioned air 42 to be forced through the lower plenum, upwards past the airfoil vane vertical surface 23 and inclined surfaces 25, where it is deflected at an angle, and through the long axis of the slots 12 in a direction which impacts the frontal surface 52 of the data server rack 50. Impact and stratification dynamics, inherent in the use of the novel method disclosed herein, act to cause the cooling air 40 to flow in a direction which continually passes the frontal intake portions 52 of the server racks 50. As this air 40 passes the front 52 of the server racks 50, the server fans operate to draw the conditioned air 40 through the server rack 50 where it is heated 41 and exhausted (32° C.) out of the back of the server racks, and into the hot aisle 58. The hot air exhaust 41 then becomes the make-up return air for recycle through the cooling loop using the present method.

Figure 7:
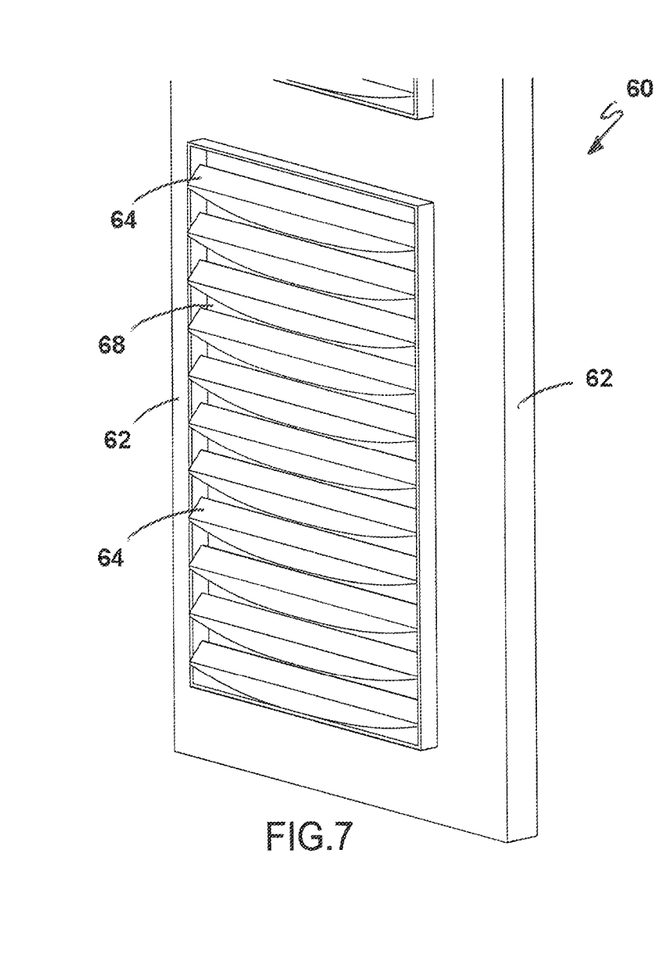
FIG. 7 is an enlarged isometric view of a lower portion of the computer server damper door shown in FIG. 6.

The floor panel 20 plate is desirably rectangular in a 60 cm×90 cm configuration. Moreover, in use, with the rectangular air-grate floor panels 20 (FIG. 7), having four corner portions, four lateral edge portions, an upper load bearing surface, a lower plenum surface, it is desirably to include a clear hole 25 positioned adjacent to each of the corner portions with a threaded collar vertically connected to the lower plenum surface and positioned in axial alignment with the clear hole for receiving a set screw 27. The set screw 27 includes an upper tool receiving end and a lower foot end and engages the threaded collar so that the tool receiving end extends through the clear hole 25. In this manner the set screw 27 is operated in either a clockwise or counterclockwise movement so that the set screw 27 adjusts the upper load bearing surface, of the floor panel 20, to a predetermined level in relation to the pedestal head. This feature of the present invention is particularly useful in retrofit application for the replacement of floor panels 20 on a panel-by-panel basis on an existing rectangular floor panel support matrix.

Figure 10:
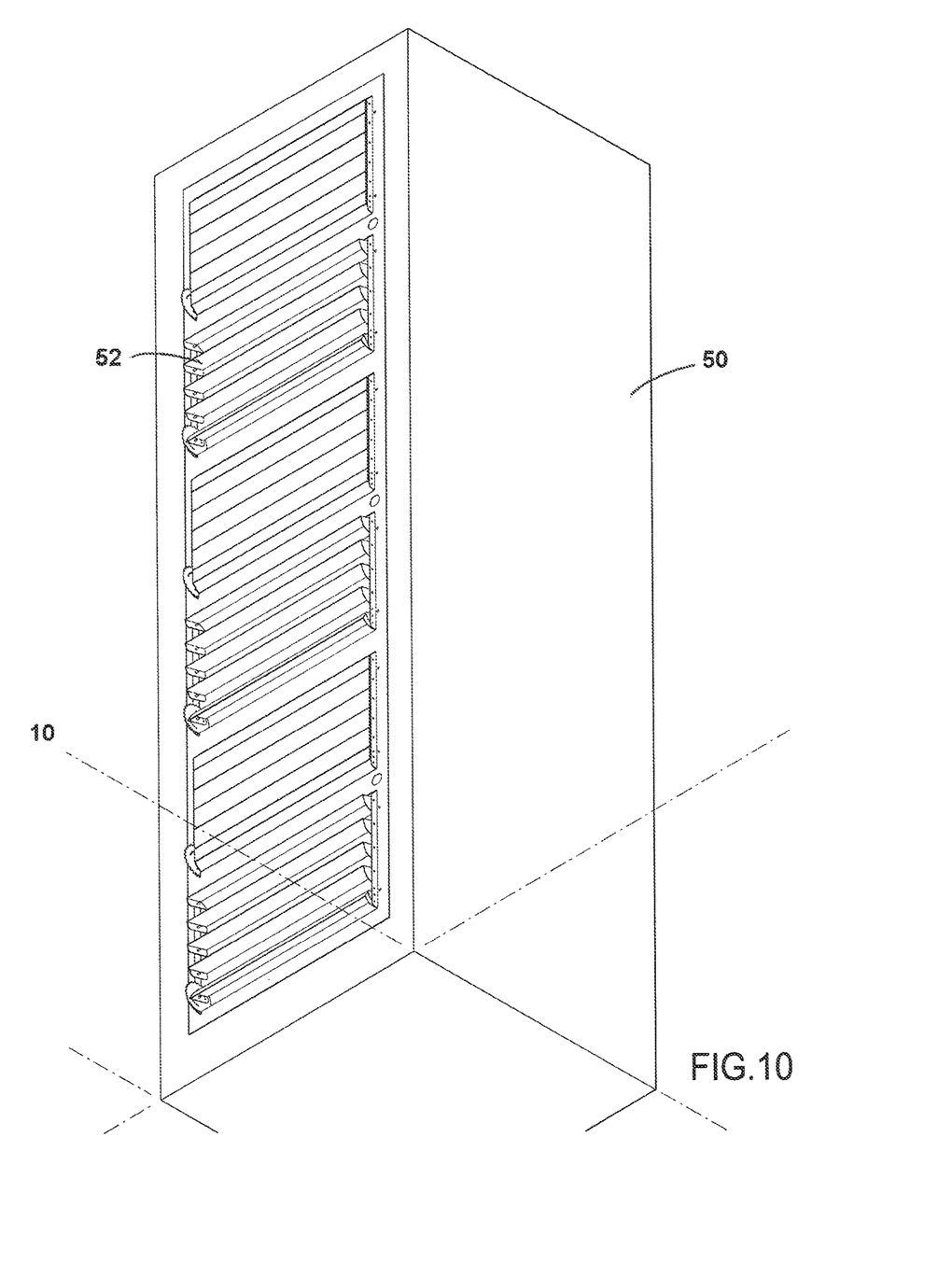
FIG. 10 is a perspective view, looking upwards from the under plenum of the raised floor showing an embodiment, where the damper door is used to cover the hot air exhaust on the back side of the server rack and the damper blade members are designed to include oppositely aligned clear holes for receiving pivot pin formations projecting from the side walls of the damper frame.

A computer server rack contains the heat generating hardware within the upper plenum of the raised floor. The server racks are generally aligned side-by-side in rows, and each row may include a stack of servers, in racks, as are well known in the art. The computer racks include a box shaped support frame. As yet another component of the method in accordance with the present invention, at least one server door 60 is included which has side walls 62 and a damper frame opening 68. The server doors 60 may be used to cover, or access, either the cold air intake in the front side of the rack, the hot air exhaust in the back side of the rack, or both. The server doors 60 are also desirably expandable for use in retrofit applications. The side walls 62 define the damper frame opening 68 and include oppositely aligned pivot pin receiving holes for receiving pivot pin formations (the holes and pins are shown, but not numbered, in FIG. 10 because of their size in the illustration) on the damper blades 64 for pivotal attachment of the damper blades 64 in the damper frame opening 68.

Damper blades 64 are pivotally mounted in the damper frame sidewalls 62 so as to extend side-to-side in a direction which is normal to the damper frame side walls 62. The damper blades preferably include a bend along their chord axis defining an outer air deflecting flange portion having a radius curve outer edge. In a preferred embodiment the damper frame sidewalls 62 include oppositely aligned pivot pin retaining holes 66, and the damper blade members 64 further include central pivot pin formations which extend outwardly along a central pivot-axis at opposite ends thereof so that the pivot pin formations are pivotally received in the pivot pin retaining holes 66 in the sidewalls 62. In yet another embodiment, which is not illustrated in the drawing figures, the damper frame sidewalls 62 each include oppositely aligned central pivot pin formations, extending inwardly along a central pivot-axis and the damper blade members include pivot pin retaining holes for pivotally receiving the pivot pin formations. In this manner the damper blades 64 may include manually, or electrically, driven drive linkages (not shown) operable connected to the damper blades 64 for operating the damper blades 64 in a range of positions between open and closed depending on the desired setting for the desired air flow rate through the servers to be cooled. As can be appreciated, and as specifically contemplated herein, it is further desirable to include either manual or electronic control systems for the thermostatic control of the damper blades 64 in open and closed positions.

While the present invention has been described in connection with the illustrated embodiments, it will be appreciated and understood that modifications may be made without departing, from the true spirit and scope of the invention.

What is claimed is:

1. A method of enhancing the cooling efficiency of a computer room having computer equipment in computer equipment racks arranged in rows between a cold aisle and a hot aisle comprising:

forming a lower plenum in said computer room using raised floor panels, said raised floor panels having slots formed in a top plate, said slots aligned in said top plate in longitudinal directions that are parallel;

supplying cooling air to said lower plenum that pressurizes said lower plenum with said cooling air and causes said cooling air to flow through said lower plenum;

directing said cooling air flowing in said lower plenum onto stationary air foil vanes that have stationary vertical surfaces and stationary inclined surfaces, said stationary vertical surfaces redirecting said cooling air flowing in said lower plenum in an upward direction towards said stationary inclined surfaces, said stationary inclined surfaces perpendicular to said longitudinal direction of said slots so that said inclined surfaces redirect said cooling air through said slots in said longitudinal directions;

aligning said raised floor panels so that said longitudinal directions of said slots in said top plate are directed towards said computer equipment racks in said cold aisle and said cooling air flowing through said slots is directed towards said computer equipment racks.

2. The method of claim 1 wherein said method of directing said cooling air flowing in said lower plenum using air foil vanes comprises:

directing said cooling air flowing in said lower plenum onto said stationary inclined surfaces using said stationary air foil vanes comprising stationary planar vertical surfaces and stationary planar inclined planar surfaces.

3. The method of claim 1 wherein said method of forming a lower plenum comprises:

placing a single row of said raised floor panels in said cold aisle.

4. A system for cooling computer equipment in a computer room comprising:

a raised floor system that forms a lower plenum in said computer room;

a cooling air supply that provides a flow of cooling air to said lower plenum;

computer equipment racks arranged in rows on said raised floor system to form cold aisles and hot aisles;

raised floor panels placed in said cold aisles having slots formed in a top plate of said raised floor panels, said slots having longitudinal directions which are aligned in said top plate so that said longitudinal directions are parallel and point towards said computer equipment racks;

stationary air foil vanes attached to an underside of said top plate, said stationary air foil vanes comprising stationary vertical surfaces and stationary inclined surfaces, said stationary vertical surfaces directing said flow of cooling air in an upward direction towards said stationary inclined surfaces, said stationary inclined surfaces disposed to direct said flow of cooling air through said slots towards said computer equipment racks.

5. The system of claim 4 wherein said stationary air foil vanes further comprise:

stationary planar vertical surfaces.

6. The system of claim 5 wherein said stationary inclined surfaces of said air foil vanes comprises a bent portion of said stationary planar vertical surface.

7. The system of claim 4 wherein said computer room comprises a portion of a data center.

8. The system of claim 7 wherein said computer equipment comprises servers.

* * * * *